United States Patent
Jin et al.

(10) Patent No.: US 10,797,013 B2
(45) Date of Patent: Oct. 6, 2020

(54) ACRYLIC RESIN COMPOSITION FOR SEALING, CURED PRODUCT OF SAME, METHOD FOR PRODUCING SAME, SEMICONDUCTOR DEVICE USING SAID RESIN COMPOSITION, AND METHOD FOR MANUFACTURING SAID SEMICONDUCTOR DEVICE

(71) Applicant: Panasonic Intellectual Property Management Co., Ltd., Osaka (JP)

(72) Inventors: Jin Jin, Osaka (JP); Naoki Kanagawa, Nara (JP); Shigeru Yamatsu, Osaka (JP); Daisuke Sasaki, Osaka (JP); Kazuki Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 95 days.

(21) Appl. No.: 15/547,965

(22) PCT Filed: Jan. 19, 2016

(86) PCT No.: PCT/JP2016/000232
§ 371 (c)(1),
(2) Date: Aug. 1, 2017

(87) PCT Pub. No.: WO2016/132671
PCT Pub. Date: Aug. 25, 2016

(65) Prior Publication Data
US 2018/0247910 A1    Aug. 30, 2018

(30) Foreign Application Priority Data
Feb. 16, 2015   (JP) .................................. 2015-028035

(51) Int. Cl.
*H01L 23/00*    (2006.01)
*C08L 33/06*    (2006.01)
(Continued)

(52) U.S. Cl.
CPC ................ *H01L 24/16* (2013.01); *C08K 3/22* (2013.01); *C08K 5/14* (2013.01); *C08K 5/5435* (2013.01);
(Continued)

(58) Field of Classification Search
CPC ..... H01L 24/16; H01L 21/4853; H01L 21/50; H01L 21/563; C08K 3/22; C08K 5/14;
(Continued)

(56) References Cited

U.S. PATENT DOCUMENTS 5,719,220 A * 2/1998 Kirtley .................... C04B 26/06
                                                             524/267
6,287,745 B1 * 9/2001 Yamamura ............ G03F 7/0037
                                                             430/269

(Continued)

FOREIGN PATENT DOCUMENTS

JP   2005-200444       7/2005
JP   2008-137854 A     6/2008
(Continued)

OTHER PUBLICATIONS

International Search Report of PCT application No. PCT/JP2016/000232 dated Apr. 5, 2016.

*Primary Examiner* — David T Karst
(74) *Attorney, Agent, or Firm* — Greenblum & Bernstein, P.L.C.

(57) ABSTRACT

A sealing acrylic resin composition contains a thermosetting acrylic resin in liquid phase, an organic peroxide, and an inorganic filler in a content proportion ranging from 50% by mass to 95% by mass, inclusive. A silane coupling agent is (Continued)

bonded to the inorganic filler, a total organic carbon content of the inorganic filler in proportion being ranging from 0.1% by mass to 1.0% by mass, inclusive, in a state before the inorganic filler is mixed with at least one of the thermosetting acrylic resin and the organic peroxide. The silane coupling agent has an acrylic group.

12 Claims, 2 Drawing Sheets

(51) Int. Cl.
| | |
|---|---|
| C09D 133/06 | (2006.01) |
| C08K 9/06 | (2006.01) |
| H01L 21/56 | (2006.01) |
| C08K 3/22 | (2006.01) |
| C08K 5/14 | (2006.01) |
| C08K 5/5435 | (2006.01) |
| C08L 33/08 | (2006.01) |
| C08L 63/00 | (2006.01) |
| H01L 21/48 | (2006.01) |
| H01L 21/50 | (2006.01) |
| C08K 3/013 | (2018.01) |
| C08L 33/10 | (2006.01) |
| C08K 3/28 | (2006.01) |
| H01L 21/60 | (2006.01) |

(52) U.S. Cl.
CPC ............... *C08K 9/06* (2013.01); *C08L 33/06* (2013.01); *C08L 33/08* (2013.01); *C08L 33/10* (2013.01); *C08L 63/00* (2013.01); *C09D 133/06* (2013.01); *H01L 21/4853* (2013.01); *H01L 21/50* (2013.01); *H01L 21/563* (2013.01); *C08K 3/013* (2018.01); *C08K 2003/222* (2013.01); *C08K 2003/2217* (2013.01); *C08K 2003/2227* (2013.01); *C08K 2003/282* (2013.01); *C08K 2201/005* (2013.01); *H01L 2021/60232* (2013.01); *H01L 2224/73204* (2013.01); *H01L 2224/81* (2013.01); *H01L 2224/83192* (2013.01)

(58) Field of Classification Search
CPC ......... C08K 5/5435; C08K 9/06; C08L 33/06; C08L 33/08; C08L 33/10; C08L 63/00
USPC .......................................................... 523/400
See application file for complete search history.

(56) References Cited

U.S. PATENT DOCUMENTS

| | | | |
|---|---|---|---|
| 2003/0219619 A1* | 11/2003 | Noro | .................... C08G 59/188 |
| | | | 428/620 |
| 2010/0331471 A1 | 12/2010 | Yamamoto et al. | |
| 2013/0143164 A1* | 6/2013 | Yabuki | ...................... C08F 2/44 |
| | | | 430/311 |

FOREIGN PATENT DOCUMENTS

| | | |
|---|---|---|
| JP | 2010-163598 A | 7/2010 |
| JP | 2011-243786 | 12/2011 |
| JP | 2015-019012 A | 1/2015 |
| WO | 2009/099034 A1 | 8/2009 |

* cited by examiner

ACRYLIC RESIN COMPOSITION FOR SEALING, CURED PRODUCT OF SAME, METHOD FOR PRODUCING SAME, SEMICONDUCTOR DEVICE USING SAID RESIN COMPOSITION, AND METHOD FOR MANUFACTURING SAID SEMICONDUCTOR DEVICE

This application is a U.S. national stage application of the PCT International Application No. PCT/JP2016/000232 filed on Jan. 19, 2016, which claims the benefit of foreign priority of Japanese patent application 2015-028035 filed on Feb. 16, 2015, the contents all of which are incorporated herein by reference.

TECHNICAL FIELD

The present invention relates to a sealing acrylic resin composition, a cured product of the sealing acrylic resin composition, a method for producing the sealing acrylic resin composition, a semiconductor device using the sealing acrylic resin composition, and a method for producing the semiconductor device. In detail, the present invention mainly relates to a sealing acrylic resin composition suitable for sealing a gap between a substrate and a semiconductor chip by pre-application type underfilling, a cured product of the sealing acrylic resin composition, and a method for producing the sealing acrylic resin composition. The present invention also relates to a method for producing a semiconductor device by sealing a gap between a substrate and a semiconductor chip according to pre-application type underfilling with the sealing acrylic resin composition, and the semiconductor device produced.

BACKGROUND

A flip-chip semiconductor chip includes a package such as a ball grid array (BGA), a land grid array (LGA), or a chip size package (CSP). In production of a semiconductor device, when such a semiconductor chip is mounded on a substrate with a face-down mounting, an underfilling technique, which seals a gap between the semiconductor chip and the substrate with a resin composition, has been widely employed. Recently, in order to improve productivity of a semiconductor device, it has been required to shorten an operation period for sealing with a resin composition. In order to shorten the operation period, it has been required to cure a resin composition in a short period.

Conventionally, a resin composition containing an epoxy resin, which is widely used, is likely to generate a void in a cured product generated, when cured in a short period. Generation of a void causes solder to flow into the void or a decline of reliability in joint between a semiconductor chip and a substrate. In order to solve such problems, use of a resin composition containing a liquid thermosetting acrylic resin is studied (see, Unexamined Japanese Patent Publication No. 2011-243786). With use of such a resin composition, it is possible to cure the resin composition in a short period, and further, a void is less likely to be generated even when the resin composition is cured in a short period. It should be noted that an inorganic filler is blended in the resin composition for a purpose of, for example, improving thermal conductivity.

SUMMARY

The present invention provides a sealing acrylic resin composition which contains a thermosetting acrylic resin and an inorganic filler, cured product of the sealing acrylic resin composition being high not only in thermal conductivity but also in moisture resistance, a method for producing the sealing acrylic resin composition, and a cured product of the sealing acrylic resin composition. Further, the present invention provides a method for producing with use of the sealing acrylic resin composition a semiconductor device high in reliability of moisture resistance, and the semiconductor device produced.

The sealing acrylic resin composition according to the present invention contains a thermosetting acrylic resin in liquid phase, an organic peroxide, and an inorganic filler in a content proportion ranging from 50% by mass to 95% by mass, inclusive. A silane coupling agent is bonded to the inorganic filler, a total organic carbon content of the inorganic filler in proportion being ranging from 0.1% by mass to 1.0% by mass, inclusive, in a state before the inorganic filler is mixed with at least one of the thermosetting acrylic resin and the organic peroxide. The silane coupling agent has an acrylic group.

The cured product of the sealing acrylic resin composition according to the present invention is a cured product of the resin composition described above, and a coefficient of thermal conductivity in the cured product is ranging from 1.0 W/mK to 10 W/mK, inclusive.

In the method for producing the sealing acrylic resin composition according to the present invention, an inorganic filler to which a silane coupling agent is bonded at a total organic carbon content in proportion ranging from 0.1% by mass to 1.0% by mass, inclusive, is first prepared. Then, an organic peroxide, the inorganic filler on which the silane coupling agent is formed, and a thermosetting acrylic resin in liquid phase are made to coexist. The inorganic filler is contained in a content proportion ranging from 50% by mass to 95% by mass, inclusive, and the silane coupling agent has an acrylic group.

The semiconductor device according to the present invention includes a substrate provided with a conductive wiring, a semiconductor chip, and a cured product of the sealing acrylic resin composition described above. The semiconductor chip includes a bump electrode, and is mounted with a face-down mounting on the substrate so that the bump electrode is electrically connected to the conductive wiring. The cured product fills a gap between the substrate and the semiconductor chip.

In the method for producing the semiconductor device according to the present invention, the sealing acrylic resin composition described above is first disposed on a substrate provided with a conductive wiring. Next, a semiconductor chip including a bump electrode is disposed on the substrate at a position where the sealing acrylic resin composition has been disposed, so that the bump electrode is disposed on the conductive wiring. Then, the sealing acrylic resin composition and the bump electrode are heated so that a cured product is formed by curing the sealing acrylic resin composition, and so that the bump electrode is electrically connected to the conductive wiring by melting the bump electrode.

According to the present invention, there can be produced a sealing acrylic resin composition which contains a thermosetting acrylic resin and an inorganic filler and whose cured product is high not only in thermal conductivity but also in moisture resistance. With use of the sealing acrylic resin composition, there can be produced a semiconductor device having a good heat dissipation and good reliability of moisture resistance.

DESCRIPTION OF EMBODIMENT

Figure 1A:
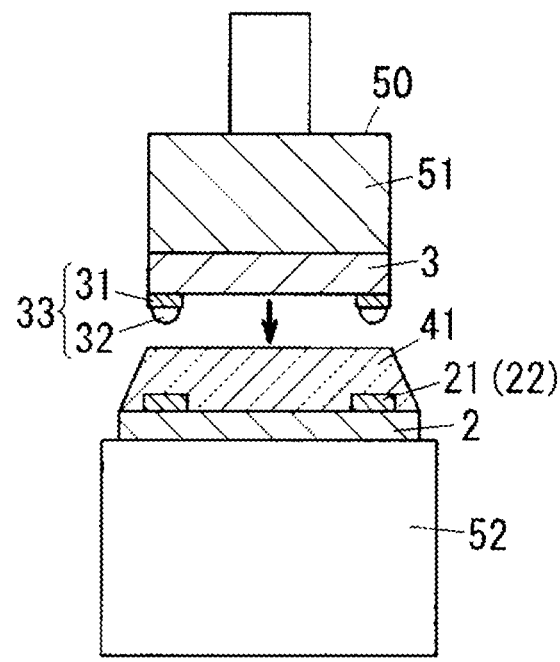
FIG. 1A is a schematic sectional view illustrating a step of manufacturing a semiconductor device in one exemplary embodiment of the present invention.

Prior to describing an exemplary embodiment of the present invention, problems in a conventional technique will briefly be described. When a resin composition containing a thermosetting acrylic resin and an inorganic filler is cured particularly in a short period, a resultant cured product is likely to generate a crack due to moisture absorption, therefore decreasing reliability in moisture resistance of a semiconductor device.

Hereinafter, an exemplary embodiment of the present invention will be described. A sealing acrylic resin composition (hereinafter, a resin composition) according to the present exemplary embodiment contains a thermosetting acrylic resin that is liquid at normal temperature, an organic peroxide, and an inorganic filler. The resin composition according to the present exemplary embodiment is suitable for an underfill or a non-conductive polymer (NCP) in producing a semiconductor device. The resin composition is particularly suitable for sealing a gap between a substrate and a semiconductor chip by pre-application type (also referred to as heat bonding) underfilling.

First, with reference to FIGS. 1A to 1D, an example of a method for manufacturing semiconductor device 1 according to the present exemplary embodiment will be described, the semiconductor device being manufactured by sealing a gap between substrate 2 and semiconductor chip 3 according to pre-application type underfilling. FIGS. 1A to 1D are sectional views each illustrating a step of manufacturing semiconductor device 1.

Substrate 2 is, for example, a mother substrate, a package substrate, or an interposer substrate. For example, substrate 2 includes an insulating substrate and conductive wiring 21. The insulating substrate is made from, for example, glass epoxy, polyimide, polyester, or ceramics. Conductive wiring 21 is formed on a surface of the insulating substrate and is made from a conductor such as copper. Conductive wiring 21 includes, for example, electrode pad 22.

Semiconductor chip 3 is, for example, a chip with a flip-chip BGA, LGA, or CSP. Alternatively, semiconductor chip 3 may be a package on package (PoP) chip. Semiconductor chip 3 includes bump electrode 33. Bump electrode 33 includes, for example, copper pillar 31 and solder bump 32 provided on a tip of pillar 31. Solder bump 32 is made from lead-free solder having a melting point of 210° C. or more. Examples of such solder include Sn-3.5Ag (melting point 221° C.), Sn-2.5AG-0.5Cu-1Bi (melting point 214° C.), Sn-0.7Cu (melting point 227° C.), and Sn-3Ag-0.5Cu (melting point 217° C.).

In the present example, with use of flip-chip bonder 50 including bonding head 51 and stage 52, semiconductor chip 3 is mounted with a face-down mounting on substrate 2.

First, as illustrated in FIG. 1A, a resin composition is disposed as underfill 41 on a surface of substrate 2 on which conductive wiring 21 is provided. As a method for disposing the resin composition, there can be exemplified a method of using a dispenser, a screen printing method, and an ink-jet method. It should be noted that an amount of the resin composition disposed on substrate 2 is appropriately optimized according to a size of semiconductor chip 3.

Figure 1B:
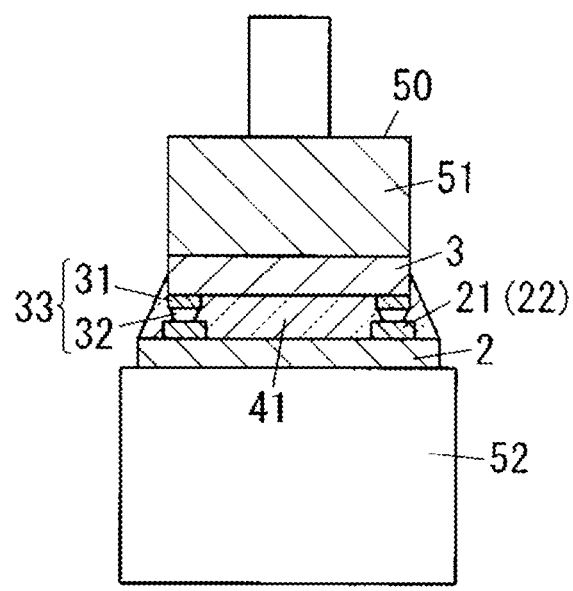
FIG. 1B is a schematic sectional view illustrating a step following the step illustrated in FIG. 1A.

Next, substrate 2 is supported by stage 52 and semiconductor chip 3 is held by bonding head 51. While the state described above is kept, bonding head 51 is moved toward stage 52 as illustrated in FIG. 1B. In this way, semiconductor chip 3 is disposed on substrate 2 at a position where the resin composition has been disposed. At this time, semiconductor chip 3 is disposed while position adjustment is performed between semiconductor chip 3 and substrate 2 so that bump electrode 33 of semiconductor chip 3 is stacked on electrode pad 22 in conductive wiring 21 of substrate 2.

Figure 1C:
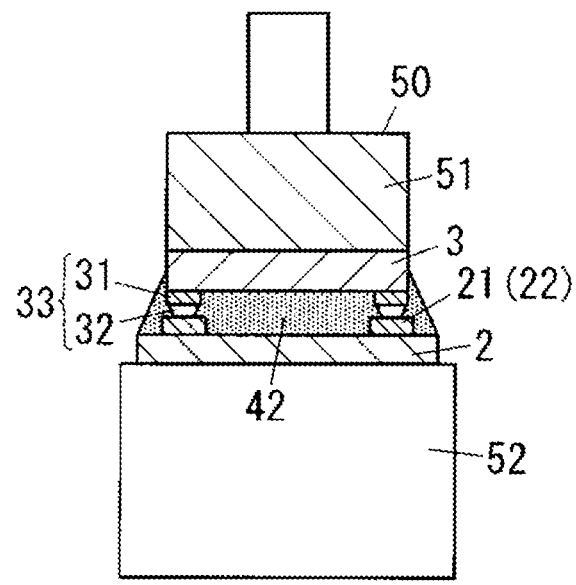
FIG. 1C is a schematic sectional view illustrating a step following the step illustrated in FIG. 1B.
Figure 1D:
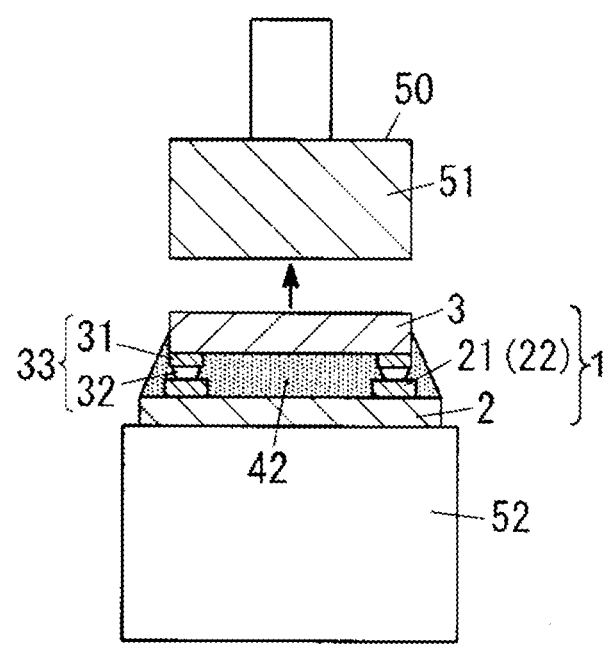
FIG. 1D is a schematic sectional view illustrating a step following the step illustrated in FIG. 1C.

While the state described above is kept, semiconductor chip 3 and substrate 2 are heated by heat through bonding head 51 and stage 52 so that bump electrode 33 and the resin composition are heated. This operation melts solder bump 32 so that bump electrode 33 is electrically connected to electrode pad 22. In addition, as illustrated in FIG. 1C, the resin composition is thermally cured so that cured product 42 is formed. Thus, a gap between semiconductor chip 3 and substrate 2 is sealed with cured product 42. As described above, semiconductor chip 3 is mounted on substrate 2 as illustrated in FIG. 1D. As a result, semiconductor device 1 that includes substrate 2, semiconductor chip 3 mounted with the face-down mounting on substrate 2, and cured product 42 that seals the gap between substrate 2 and semiconductor chip 3 is obtained.

A temperature for heating bump electrode 33 and the resin composition is appropriately set to a temperature exceeding a melting point of solder bump 32 according to composition of solder bump 32 and composition of the resin composition. A maximum heating temperature ranges, for example, from 230° C. to 280° C. In addition, while a heating period is appropriately set in view of, for example, a melting point of solder bump 32 and conditions such as various pieces of equipment of a heating apparatus, the heating period preferably ranges from 3 seconds to 20 seconds. Such a heating temperature and a heating period particularly increase productivity of semiconductor device 1. Further, in the present exemplary embodiment, even when the resin composition is cured in such a short period, cured product 42 has high moisture resistance. Therefore, semiconductor device 1 has high reliability in moisture resistance.

It should be noted that the resin composition according to the present exemplary embodiment is also applicable to a use other than a use as an underfill. For example, the resin composition may be applied as an adhesive agent for adhering semiconductor chip 3 with a heat dissipating component.

In the present exemplary embodiment, even when, for example, the gap between substrate 2 and semiconductor chip 3 ranges from 5 μm to 150 μm and an interval between adjacent bump electrodes 33 ranges from 5 μm to 150 μm, excellent connection stability and connection reliability, and high heat dissipation are realized. Particularly, the inorganic filler having an average particle size ranging from 0.5 μm to 5.0 μm can give high connection stability even when the interval between bump electrodes 33 is less than 60 μm or less than 50 μm.

Further, semiconductor device 1 obtained in the present exemplary embodiment has high reliability in moisture resistance. In the present exemplary embodiment, semiconductor device 1 can also be obtained that satisfies, for example, Level 2 or Level 2a (also referred to as MLv 2aa) specified in IPC/JEDEC (Joint Electron Device Engineering Council) J-STD-20 MSL (Moisture Sensitivity Levels) Classifications. It should be noted that JEDEC is a solid state technology association that is one of EIA (Electronic Industries Alliance) bodies and a trade association for standardizing a solid state technology.

The resin composition containing a thermosetting acrylic resin that is liquid at normal temperature is less likely to generate a void in a resultant cured product when thermally cured. This is considered to be because viscosity of the resin composition is increased in an initial stage of curing due to a radical reaction of the thermosetting acrylic resin. Particularly, the resin composition is less likely to generate a void in a cured product even when cured in a short period, therefore enabling improvement in productivity of semiconductor device 1. It should be noted that the phrase "liquid at normal temperature" means that the thermosetting acrylic resin has flowability under atmospheric pressure at a temperature of 18° C. Particularly, the thermosetting acrylic resin preferably has flowability under atmospheric pressure in any temperature ranging from 5° C. to 28° C. When a liquid state is defined by viscosity, the thermosetting acrylic resin has a viscosity of desirably 1000 Pas or less, further desirably 100 Pa's or less and 10 Pa's or less. If the thermosetting acrylic resin has a viscosity at a temperature of 18° C. of more than 1000 Pa's, it is possible that viscosity of the resin composition to which the inorganic filler in a content proportion of 50% by mass or more has been added may excessively increase.

The organic peroxide is a radical polymerization initiator. The resin composition contains the organic peroxide, so that the viscosity of the resin composition is easily increased promptly in an initial stage of a process where the resin composition is thermally cured. Therefore, generation of a void is suppressed. Further, the organic peroxide can sufficiently promptly progress a curing reaction. Therefore, the resin composition can be promptly cured, and semiconductor chip 3 is less likely to be peeled from cured product 42.

The inorganic filler can improve thermal conductivity of cured product 42. Therefore, heat generated from semiconductor chip 3 is efficiently dissipated via cured product 42. Further, the inorganic filler enables adjustment of a thermal expansion coefficient of cured product 42. The inorganic filler is contained in a content proportion ranging from 50% by mass to 95% by mass, inclusive, relative to a whole resin composition. Therefore, cured product 42 has high thermal conductivity, and heat generated from semiconductor chip 3 can be efficiently dissipated. Particularly, for improvement in thermal conductivity, the inorganic filler is contained in a content proportion of preferably 70% by mass or more, further preferably 75% by mass or more.

The inorganic filler is pretreated with a silane coupling agent. The silane coupling agent that treats a surface of the inorganic filler has an acrylic group. It should be noted that the acrylic group may be an acryloyl group, an acrylyl group, an acyl group, or a methacrylic group. That is, the silane coupling agent that treats a surface of the inorganic filler has an acrylic group or at least one of groups referred to as an acryloyl group, an acrylyl group, an acyl group, and a methacrylic group. The inorganic filler that has been surface-treated with such a silane coupling agent is excellent in affinity and chemical bonding property with the thermosetting acrylic resin in liquid phase.

An adsorption layer containing organic carbon is formed on the surface of the inorganic filler. This adsorption layer preferably contains, in addition to the silane coupling agent, a thermosetting acrylic resin component a part of which has affinity for or is chemically bonded with the silane coupling agent. The inorganic filler is covered with the silane coupling agent or the thermosetting resin as described above to stabilize pot life (e.g., change in viscosity over time) of the resin composition. Further, generation of a crack in cured product 42 formed through curing of the resin composition and peeling of cured product 42 from semiconductor chip 3 can be suppressed.

It should be noted that the silane coupling agent is bonded to the inorganic filler, a total organic carbon content of the inorganic filler in proportion being ranging from 0.1% by mass to 1.0% by mass, inclusive.

In the present exemplary embodiment, the resin composition contains the inorganic filler at high concentration as described above, so that cured product 42 has high thermal conductivity. In addition, the inorganic filler is treated with the silane coupling agent and has a total organic carbon content in proportion of 0.1% by mass or more, so that particles of the inorganic filler are protected by the silane coupling agent. Further, the inorganic filler not only suppresses adsorption of moisture to the inorganic filler but also makes cured product 42 less likely to generate a fine crack and void in the cured product, so that cured product 42 is less likely to absorb moisture. Therefore, cured product 42 has high moisture resistance, and semiconductor device 1 including cured product 42 has high reliability in moisture resistance. This is considered to be because a periphery of particles of the inorganic filler is sufficiently covered with the silane coupling agent to keep preferable affinity of the inorganic filler for the thermosetting acrylic resin. Peeling is considered to be less likely to occur in an interface between a cured resin in cured product 42 that is formed through curing of the thermosetting acrylic resin and the particles of the inorganic filler. In addition, it is considered that peeling is less likely to occur because, even in curing of the resin composition in a short period, the silane coupling agent sufficiently reduces a change in size generated through the curing. It is considered that, with such an action of the silane coupling agent, a crack is less likely to occur in the cured resin and the particles. It should be noted that when the inorganic filler having been treated with the silane coupling agent has a total organic carbon content in proportion of more than 1.0% by mass, the viscosity of the resin composition may possibly be increased excessively. It should be noted that the inorganic filler further preferably has a total organic carbon content in proportion ranging from 0.1% by mass to 0.8% by mass, inclusive.

Next, measurement to the total organic carbon content of the inorganic filler will be described. A total organic carbon content of the inorganic filler not having an organic carbon component on a surface of the inorganic filler or the like is 0% by mass in proportion. The measurement to the total organic carbon content of the inorganic filler that has been surface-treated with the silane coupling agent can be performed when the inorganic filler is in a state of powder, that is, in a state before the inorganic filler is mixed with at least one of the thermosetting acrylic resin and the organic peroxide.

The total organic carbon content of the inorganic filler can be measured with a total organic carbon (TOC) measuring apparatus. Particularly, the total organic carbon content is preferably measured by a combustion oxidation method. Specifically, the inorganic filler is first heated to oxidize organic-state carbon in the silane coupling agent that is attached to particles of the inorganic filler, so that carbon dioxide is generated. An amount of generated carbon dioxide is measured, and the total organic carbon content is calculated on the basis of the amount of generated carbon dioxide. It should be noted that, as a method for measuring the total organic carbon content, a wet oxidation method as well as such a combustion oxidation method is applied; however, the inorganic filler such as alumina is thermally stable, and therefore, the combustion oxidation method is preferably applied.

The total organic carbon content of the inorganic filler that has been added to the resin composition can be measured by isolating the inorganic filler from the resin composition by an ultrasonic cleaning technique.

The total organic carbon content of the inorganic filler that has been isolated from the resin composition as described above is, in proportion, desirably 0.1% by mass or more, more preferably 0.13% by mass or more, further preferably 0.15% by mass or more. It should be noted that the total organic carbon content of the inorganic filler that has been isolated may have, in addition to a content of carbon attributed to the silane coupling agent, a content of carbon attributed to, for example, an acrylic resin component having affinity for a part of the silane coupling agent. Even in such a case, the total organic carbon content in proportion is desirably 0.1% by mass or more.

When the silane coupling agent having such low adsorption power as to be easily removed by the isolation is used, viscosity of the resin composition may possibly change greatly over time. In this case, generation of a crack and peeling due to moisture absorption in reliability of moisture resistance after curing may occur.

On the other hand, the adsorption layer that is strongly bonded in terms of the total organic carbon content in proportion of 0.1% by mass or more even after the isolation by an ultrasonic wave is formed of, for example, the silane coupling agent having high adsorption power. Presence of such an adsorption layer decreases the change in viscosity of the resin composition over time and suppresses the generation of a crack and peeling in reliability of moisture resistance after curing.

Next, components in the resin composition will be described in detail. First, the thermosetting acrylic resin will be described.

In order to secure heat resistance of cured product 42, the thermosetting acrylic resin contains a compound having preferably two or more (meth)acryloyl groups per molecule, more preferably a compound having 2 to 6 (meth)acryloyl groups per molecule, further preferably a compound having two (meth)acryloyl groups per molecule. The thermosetting acrylic resin may also have at least one of an acryloyl group (acrylyl group, acrylic group), an acyl group, and a methacrylic group.

Examples of the compound having two (meth)acryloyl groups per molecule include ethylene glycol di(meth)acrylate, 1,4-butane diol di(meth)acrylate, 1,6-hexanediol di(meth)acrylate, 1,9-nonanediol di(meth)acrylate, 1,3-butane diol di(meth)acrylate, neopentylglycol di(meth)acrylate, dimerdiol di(meth)acrylate, dimethylol tricyclodecane di(meth)acrylate, diethyleneglycol di(meth)acrylate, triethylene glycol di(meth)acrylate, tetraethylene glycol di(meth)acrylate, polyethyleneglycol di(meth)acrylate, tripropylene glycol di(meth)acrylate, polypropylene glycol di(meth)acrylate, glycerol di(meth)acrylate, trimethylolpropane di(meth)acrylate, pentaerythritol di(meth)acrylate, zinc di(meth)acrylate, cyclohexanediol di(meth)acrylate, cyclohexane dimethanol di(meth)acrylate, cyclohexanediethanol di(meth)acrylate, cyclohexane dialkyl alcohol di(meth)acrylate, and dimethanoltricyclodecane di(meth)acrylate.

Examples of the compound having two (meth)acryloyl groups per molecule include a product obtained by reacting 1 mol of bisphenol A, bisphenol F, or bisphenol AD with 2 mol of glycidyl acrylate, and a product obtained by reacting 1 mol of bisphenol A, bisphenol F, or bisphenol AD with 2 mol of glycidyl methacrylate.

An example of the compound having two or more (meth)acryloyl groups per molecule includes a (meth)acrylate having a crosslinking polycyclic structure. Specific examples of the compound having two or more (meth)acryloyl groups per molecule include a compound represented by a formula (I) and a compound represented by a formula (II). Use of these compounds particularly improves the heat resistance of cured product 42.

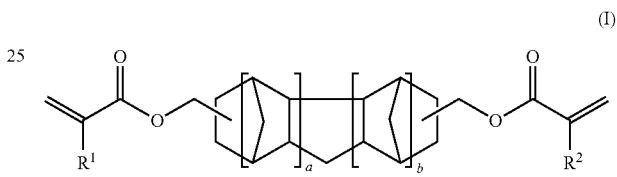

In the formula (I), R1 and R2 each represent a hydrogen atom or a methyl group, a is 1 or 2, and b is 0 or 1.

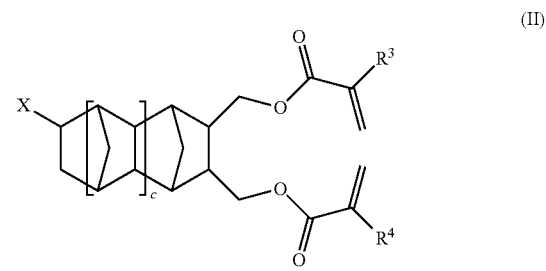

In the formula (II), R3 and R4 each represent a hydrogen atom or a methyl group, X represents a hydrogen atom, a methyl group, a methylol group, an amino group, or a (meth)acryloyloxymethyl group, and c is 0 or 1.

More specific examples of the (meth)acrylate having a crosslinking polycyclic structure include compounds as described below: a (meth)acrylate having the formula (I) where a is 1 and b is 0 and having a dicyclopentadiene skeleton; a (meth)acrylate having the formula (II) where c is 1 and having a perhydro-1,4:5,8-dimethanonaphthalene skeleton; a (meth)acrylate having the formula (II) where c is 0 and having a norbornane skeleton; dicyclopentadienyl diacrylate (tricyclodecane dimethanol diacrylate) having the formula (I) where R1 and R2 are a hydrogen atom, a is 1, and b is 0; perhydro-1,4:5,8-dimethanonaphthalene-2,3,7-trimethylol triacrylate having the formula (II) where X is an acryloyloxymethyl group, R3, and R4 are a hydrogen atom, and c is 1; norbornanedimethylol diacrylate having the formula (II) where X, R3, and R4 are a hydrogen atom and c is 0; and perhydro-1,4:5,8-dimethanonaphthalene-2,3-dimethylol diacrylate having the formula (II) where X, R3, and R4 are a hydrogen atom and c is 1. Particularly, the (meth)acrylate having a crosslinking polycyclic structure preferably contains at least one of dicyclopentadienyl diacrylate and norbornanedimethylol diacrylate.

An example of the compound having two or more (meth) acryloyl groups includes a di(meth)acrylate having a structure where an alkylene oxide is added to a bisphenol skeleton. Specific examples of the compound having two or more (meth)acryloyl groups include a compound represented by a formula (III) and a compound represented by a formula (IV). Use of these compounds improves adhesion between cured product 42 of the resin composition and semiconductor chip 3 and between cured product 42 of the resin composition and substrate 2.

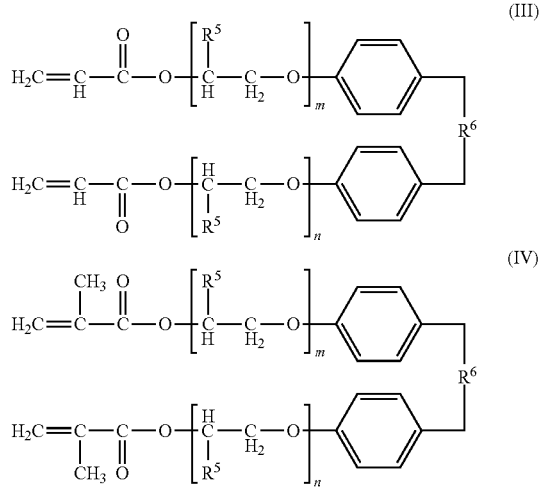

In the formulae (III) and (IV), R5 represents hydrogen, a methyl group, or an ethyl group, R6 represents a divalent organic group, and m and n each represent an integer from 1 to 20.

More specific examples of the di(meth)acrylate having a structure where an alkylene oxide is added to a bisphenol skeleton include EO-modified bisphenol A di(meth)acrylates (n=2 to 20) such as ARONIX M-210, M211B (manufactured by Toagosei Co., Ltd.), and NK ester ABE-300, A-BPE-4, A-BPE-6, A-BPE-10, A-BPE-20, A-BPE-30, BPE-100, BPE-200, BPE-500, BPE-900, and BPE-1300N (manufactured by Shin-Nakamura Chemical Co., Ltd.); EO-modified bisphenol F di(meth)acrylates (n=2 to 20) such as ARONIX M-208 (manufactured by Toagosei Co., Ltd.); PO-modified bisphenol A di(meth)acrylates (n=2 to 20) such as Denacol Acrylate DA-250 (manufactured by Nagase ChemteX Corporation) and Viscoat 540 (manufactured by Osaka Organic Chemical Industry Ltd.); and PO-modified phthalic acid diacrylates such as Denacol Acrylate DA-721 (manufactured by Nagase ChemteX Corporation).

The compound having two or more (meth)acryloyl groups is preferably an epoxy (meth)acrylate. When containing an epoxy (meth)acrylate, particularly an epoxy resin, the resin composition improves in reactivity, and the heat resistance and the adhesion of cured product 42 also improve.

The epoxy (meth)acrylate is, for example, an oligomer that is a product obtained through addition reaction of an epoxy resin with an unsaturated monobasic acid such as acrylic acid or methacrylic acid.

The epoxy resin that is a raw material of the epoxy meth(acrylate) contains a diglycidyl compound (bisphenol epoxy resin). The glycidyl compound can be obtained through, for example, condensation of bisphenols represented by a bisphenol such as bisphenol A or bisphenol F, with an epihalohydrin. The epoxy resin may be an epoxy resin having a phenol skeleton. An example of the epoxy resin having a phenol skeleton includes a polyhydric glycidyl ether. Specific examples of the polyhydric glycidyl ether include a phenol novolak epoxy resin and a cresol novolak epoxy resin. Such an epoxy resin can be obtained through condensation of a phenol novolak that is a condensation product of phenol or cresol with an aldehyde represented by formalin, with an epihalohydrin. The epoxy resin may also be an epoxy resin having a cyclohexyl ring.

The epoxy (meth)acrylate preferably contains a bisphenol A epoxy acrylate represented by a following formula (V). This is a solid or a liquid having a viscosity of 10 Pa·s or more at a temperature of 25° C.

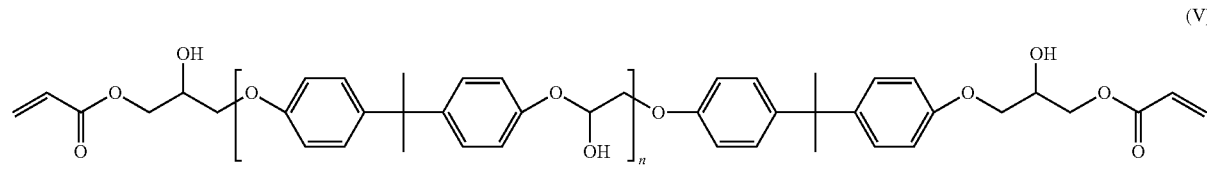

In the formula (V), n represents a positive integer.

Examples of a commercial product of the bisphenol A epoxy acrylate include Denacol Acrylate DA-250 (manufactured by Nagase ChemteX Corporation, 60 Pa·s at 25° C.), Denacol Acrylate DA-721 (manufactured by Nagase ChemteX Corporation, 100 Pa·s at 25° C.), RIPOXY VR-60 (manufactured by SHOWA HIGHPOLYMER CO., LTD., solid at normal temperature), and RIPDXY VR-77 (manufactured by SHOWA HIGHPOLYMER CO., LTD., 100 PA·s at 25° C.).

Examples of a compound having three or more (meth) acryloyl groups include pentaerythritol triacrylate, pentaerythritol tetraacrylate, pentaerythritol pentaacrylate, ethoxylated (3) trimethylolpropane triacrylate, ethoxylated (6) trimethylolpropane triacrylate, ethoxylated (9) trimethylolpropane triacrylate, propoxylated (6) trimethylolpropane triacrylate, propoxylated (3) glyceryl triacrylate, highpropoxylated (55) glyceryl triacrylate, ethoxylated (15) trimethylolpropane triacrylate, trimethylolpropane trimethacrylate, tetraethylene glycol diacrylate, dimethylolpropane tetraacrylate, tripropylene glycol diacrylate, pentaacrylate ester, 1,3-adamantane diol dimethacrylate, 1,3-adamantane diol diacrylate, 1,3-adamantane dimethanol dimethacrylate, and 1,3-adamantane dimethanol diacrylate.

The thermosetting acrylic resin can contain, for example, 10% by mass to 50% by mass of a meth(acrylate) having a crosslinking polycyclic structure, 3% by mass to 20% by mass of a di(meth)acrylate having a structure where an alkylene oxide is added to a bisphenol skeleton, and 5% by mass to 30% by mass of an epoxy meth(acrylate).

The thermosetting acrylic resin may also contain various vinyl monomers other than the components described above, for example, a monofunctional vinyl monomer.

Next, the organic peroxide as a radical initiator will be described. A 1-minute half-life temperature of the organic peroxide ranges preferably from 120° C. to 195° C., more preferably from 150° C. to 190° C. The organic peroxide having a 1-minute half-life temperature in the above ranges promptly increases the viscosity of the resin composition without inhibiting wettability between solder-made bump electrode 33 and conductive wiring 21 in an initial stage of a process where the resin composition is thermally cured. Thus, generation of a void in cured product 42 is suppressed. Sufficiently prompt progress in a curing reaction also suppresses peeling of semiconductor chip 3 from cured product 42.

Specific examples of the organic peroxide include following compounds. Hereinafter, the compounds are shown accompanied by the 1-minute half-life temperature: t-butylperoxy-2-ethylhexylmonocarbonate (161.4° C.), t-butylperoxybenzoate (166.8° C.), t-butylcumyl peroxide (173.3° C.), dicumyl peroxide (175.2° C.), α,α'-di(t-butylperoxy)diisopropylbenzene (175.4° C.), 2,5-dimethyl-2,5-di(t-butylperoxy)hexane (179.8° C.), di-t-butylperoxide (185.9° C.), and 2,5-dimethyl-2,5-bis(t-butylperoxy)hexyne (194.3° C.).

A content rate of the organic peroxide preferably ranges from 0.2 parts by mass to 2 parts by mass relative to 100 parts by mass of the thermosetting acrylic resin. The organic peroxide in the above range can make the viscosity of the resin composition stable and suppress a decrease in adhesion.

Next, the inorganic filler will be described. The inorganic filler contains at least one material selected from the group consisting of, for example, a silica powder, a metal oxide, a metal nitride, a silicate, a carbonate, and a hydroxide. Examples of the silica powder include fused silica such as fused spherical silica and fused pulverized silica, synthetic silica, and crystalline silica. Examples of the metal oxide include alumina and titanium oxide. Examples of the metal nitride include aluminum nitride. Examples of the silicate include talc, fired clay, unfired clay, mica, and glass. Examples of the carbonate include calcium carbonate, magnesium carbonate, and hydrotalcite. Examples of the hydroxide include aluminum hydroxide, magnesium hydroxide, and calcium hydroxide.

Particularly, the inorganic filler contains preferably a metal oxide or a metal nitride, more preferably at least any one of alumina, aluminum nitride, and magnesium oxide. The inorganic filler containing such a material particularly increases the thermal conductivity of cured product 42, particularly increasing the heat dissipation of semiconductor device 1. Further, the inorganic filler containing such a material facilitates a surface treatment with the silane coupling agent on particles of the inorganic filler, thus increasing not only the coefficient of thermal conductivity but also the moisture resistance of cured product 42. The inorganic filler particularly preferably contains alumina. The inorganic filler containing alumina remarkably increases the thermal conductivity of cured product 42 and the heat dissipation of semiconductor 1 because alumina has a coefficient of thermal conductivity of as high as 30 W/mk. A content proportion of alumina ranges preferably from 50% by mass to 95% by mass, more preferably from 70% by mass to 95% by mass relative to a whole resin composition.

A shape of the inorganic filler is not particularly limited, and may be, for example, granular, needle-shaped, scale-shaped, or spherical. Especially, the inorganic filler is preferably spherical to improve dispersibility of the inorganic filler in the resin composition and to control the viscosity of the resin composition.

The inorganic filler preferably has an average particle size smaller than a size between substrate 2 and semiconductor chip 3 mounted on substrate 2. Further, the inorganic filler has an average particle size of preferably 10 μm or less, more preferably 5 μm or less, more preferably 3.5 μm or less, further preferably 3 μm or less, particularly preferably 2 μm or less to improve filling density of the inorganic filler in the resin composition and cured product 42 and to adjust the viscosity of the resin composition. In addition, the inorganic filler has an average particle size of 0.5 μm or more, more preferably 0.7 μm or more. The average particle size ranges, for example, from 0.5 μm to 5.0 μm and may also range from 0.7 μm to 3.5 μm. In the present exemplary embodiment, even when the inorganic filler has such an average particle size, the dispersibility of the inorganic filler in the resin composition and cured product 42 of the resin composition is preferable due to an action of a cyanic acid ester compound.

It should be noted that the average particle size in the present exemplary embodiment is a median size calculated from a result of particle size distribution measurement by a laser beam diffraction method.

In order to adjust the viscosity of the resin composition or a physical property of cured product 42, the inorganic filler may contain two or more materials having different average particle sizes.

The silane coupling agent applied to a surface treatment of the inorganic filler preferably further has at least one functional group of a vinyl group and an epoxy group. The silane coupling agent further having at least one functional group of a vinyl group and an epoxy group facilitates adjustment of the total organic carbon content of the inorganic filler to easily prepare an inorganic filler having a total organic carbon content in proportion ranging from 0.1% by mass to 1.0% by mass, inclusive. The silane coupling agent contains at least one component selected from the group consisting of, for example, acrylsilane, epoxysilane, vinylsilane, phenylsilane, and methacrylsilane. The treatment of the inorganic filler with the silane coupling agent also contributes to improvement in dispersibility of the inorganic filler in the resin composition and a reduction in viscosity of the resin composition. When the silane coupling agent contains at least one of acrylsilane and phenylsilane, or at least one of methacrylsilane and phenylsilane, the viscosity of the resin composition particularly decreases. This is considered to be because a phenyl group and an acrylic group or a methacrylic group in the silane coupling agent increase compatibility between the silane coupling agent and the thermosetting acrylic resin.

Particularly, phenylsilane and methacrylsilane are effective to form a strong bond with the surface of the inorganic filler. The silane coupling agent that forms a strong bond with the surface of the inorganic filler as described above is less likely to be desorbed by, for example, solvent cleaning. In addition, when such a silane coupling agent is kneaded with, for example, the thermosetting acrylic resin to constitute a resin composition, the resin composition is excellent in storage stability, reducing a change in viscosity of the resin composition over time.

Further, the silane coupling agent having a methacrylic group (e.g., methacrylsilane) forms a strong bond with the surface of the inorganic filler and further increases the compatibility between the silane coupling agent and the thermosetting acrylic resin. As a result, the silane coupling agent having a methacrylic group forms an adsorption layer having a strong bond with the surface of the inorganic filler and increases the compatibility between the adsorption layer and a methacrylic resin. As a result, the adsorption layer that contains the silane coupling agent containing methacrylic acid may possibly form an affinity layer containing a methacrylic resin on a surface of the adsorption layer. Such an affinity layer functions as a type of adsorption layer. It should be noted that both the affinity layer and the adsorption layer are adsorption layers containing the silane coupling agent that has been adsorbed to the surface of the inorganic filler, unless the layers are removed by a plurality of times of ultrasonic cleaning. An adsorption layer less likely to be removed by such a plurality of times of ultrasonic cleaning or the like is excellent in storage stability, reducing a change in viscosity of the resin composition over time even when the silane coupling agent is kneaded with, for example, the thermosetting acrylic resin to constitute a resin composition.

On the other hand, for example, hydroxy-terminated dimethylpolysiloxane having a silanol group on both ends is sometimes less likely to form a strong bond with the surface of the inorganic filler and comparatively easily washed away by, for example, solvent cleaning. In addition, when such a silane coupling agent is kneaded with, for example, the thermosetting acrylic resin to prepare a resin composition, the silane coupling agent may possibly change in storage stability of the resin composition, increasing a change in viscosity of the resin composition over time.

Use of the silane coupling agent having alone a total organic carbon content in proportion of 30% by mass or more particularly increases the compatibility between the silane coupling agent and the thermosetting acrylic resin. Therefore, the viscosity of the resin composition may possibly particularly be reduced. Further, the silane coupling agent can particularly effectively exhibit a function as a coupling agent.

On the other hand, producing the silane coupling agent having a total organic carbon content in proportion of more than 70% by mass requires a high cost because of difficult designing of the silane coupling agent. Therefore, such a silane coupling agent is not sometimes practical.

From the reasons described above, the silane coupling agent has itself a total organic carbon content in proportion ranging preferably from 30% by mass to 70% by mass, inclusive, particularly preferably from 40% by mass to 60% by mass, inclusive.

The resin composition may contain an activator as flux. In this case, by an action of the activator, an oxide film on a surface of solder in semiconductor chip 3 is removed during reflow so that reliability in electric connection between semiconductor chip 3 and substrate 2 is improved.

The activator contains at least one component selected from the group consisting of, for example, organic acids, various amines, and salts thereof. Particularly, the activator is preferably acidic flux. That is, the activator preferably contains an organic acid. The activator containing an organic acid can particularly improve the wettability between bump electrode 33 and conductive wiring 21.

The organic acid contains at least one compound selected from the group consisting of, for example, abietic acid, glutaric acid, succinic acid, malonic acid, oxalic acid, adipic acid, pimelic acid, suberic acid, azelaic acid, diglycolic acid, thiodiglycolic acid, phthalic acid, isophthalic acid, terephthalic acid, propanetricarboxylic acid, citric acid, and tartaric acid. Particularly, the organic acid preferably contains at least one compound selected from the group consisting of abietic acid, glutaric acid, and oxalic acid in order to particularly improve the wettability between bump electrode 33 and conductive wiring 21.

A content proportion of the activator ranges preferably from 0.1% by mass to 20% by mass, inclusive, more preferably from 1% by mass to 10% by mass, inclusive, relative to a whole resin composition. The activator in the above ranges particularly exhibits flux activity to particularly increase the wettability between solder and conductive wiring 21. Further, the activator in the above ranges can be prevented from embrittling cured product 42 of the resin composition, impairing reliability in insulation of cured product 42, and also bleeding from cured product 42.

It should be noted that the resin composition may contain an additive other than the components described above within a range not to impair the effects of the present invention. Examples of the additive include an antifoaming agent, a leveling agent, a low stress agent, and a pigment. The resin composition, however, preferably contains no solvent.

Next, an example of a method for preparing the resin composition will be described. First, components of the resin composition other than the inorganic filler are simultaneously or separately blended to prepare a mixture. The mixture is mixed under stirring while heating or cooling is performed as necessary. Next, the inorganic filler is added to the mixture. The inorganic filler is treated with the silane coupling agent before added to the mixture. Next, the mixture is mixed under re-stirring while heating or cooling is performed as necessary. Thus, a resin composition can be prepared. For stirring the mixture, there can be used, for example, a disper, a planetary mixer, a ball mill, and a three roll mill singly or in combination. It should be noted that the inorganic filler may be mixed with a part of the components of the resin composition (e.g., the thermosetting acrylic resin) to form a mixture, with which another component (e.g., the organic peroxide) is mixed.

It should be noted that the viscosity of the resin composition is preferably 200 Pa·s or less as measured under conditions at a temperature of 25° C. and a rotation speed of 50 rpm with use of a B-type rotational viscometer. In this case, a property of filling in a fine space can be improved. The resin composition has a viscosity of more preferably 100 Pa·s or less, further preferably 60 Pa·s or less. In addition, the resin composition has a viscosity of preferably 1 Pa·s or more, more preferably 3 Pa·s or more, further preferably 5 Pa·s or more. The resin composition having a viscosity in the above ranges holds its shape stably on substrate 2 when applied onto substrate 2. Further, the resin composition having a viscosity ranging from 1 Pa·s to 200 Pa·s, inclusive, particularly improves operability when the resin composition is disposed on substrate 2. The resin composition has a viscosity ranging more preferably from 5 Pa·s to 100 Pa·s, inclusive, particularly preferably from 5 Pa·s to 60 Pa·s, inclusive.

The resin composition also preferably has a viscosity ranging from 15 Pa·s to 600 Pa·s, inclusive, when the rotation speed during measurement is changed to 5 rpm, that is, as measured under conditions at a temperature of 25° C. and a rotation speed of 5 rpm with use of a B-type rotational viscometer. As described above, when the viscosity or rheology of the resin composition is adjusted so that the viscosity measured at a rotation speed of 5 rpm becomes 2 to 4 times the viscosity measured at a rotation speed of 50 rpm, coatability of the resin composition particularly increases.

The viscosity of the resin composition as described above can be realized by adjusting composition of the resin composition within a range of the description described above.

Cured product 42 obtained through thermal curing of the resin composition preferably has a coefficient of thermal conductivity of 1.0 W/mk or more. In this case, the heat dissipation of semiconductor device 1 including cured product 42 increases. Such a high coefficient of thermal conductivity can be realized by adjusting composition of the resin composition within a range of the description described above. The higher the coefficient of thermal conductivity of cured product 42 is, the higher the heat dissipation of semiconductor device 1 is. An increase in content of the inorganic filler for improving the coefficient of thermal conductivity, however, increases the viscosity of the resin composition. For example, a viscosity of more than 200 Pa·s may possibly affect the coatability of the resin composition. An attempt to improve the coefficient of thermal conductivity while suppressing a rise in viscosity requires a special material such as a diamond powder. Therefore, the coefficient of thermal conductivity of cured product 42 is preferably 10 W/mK or less.

EXAMPLES

[Preparation of Composition]

First, in each of examples and comparative examples, components other than the inorganic filler among the components shown in Tables 1 and 2 are blended and mixed under stirring to prepare a mixture. The inorganic filler is added to the mixture and further mixed under stirring to prepare a sealing acrylic resin composition in liquid phase.

The detail of the components shown in Tables 1 and 2 are as follows:

thermosetting acrylic resin A: tricyclodecane dimethanol diacrylate;
thermosetting acrylic resin B: bisphenol A epoxy acrylate;
peroxide: dicumyl peroxide;
epoxy resin: bisphenol A epoxy resin;
curing agent: imidazole;
inorganic filler A: alumina particles that have been treated with a silane coupling agent (methacrylsilane) having a methacrylic group and have a total organic carbon content in proportion of 0.16% by mass and an average particle size of 3.5 μm;
inorganic filler B: alumina particles that have not been treated with a coupling agent and have an average particle size of 3.5 μm;
inorganic filler C: alumina particles that have been treated with hydroxy-terminated dimethylpolysiloxane and have a total organic carbon content in proportion of 0.48% by mass and an average particle size of 3.5 μm;
inorganic filler D: alumina particles that have been treated with a silane coupling agent (methacrylsilane) having a methacrylic group and have a total organic carbon content in proportion of 0.40% by mass and an average particle size of 0.7 μm;
inorganic filler E: alumina particles that have not been treated with a coupling agent and have an average particle size of 0.7 μm; and inorganic filler F: alumina particles that have been treated with hydroxy-terminated dimethylpolysiloxane and have a total organic carbon content in proportion of 0.40% by mass and an average particle size of 0.7 μm.

[Silane Coupling Treatment]

A silane coupling treatment was performed as follows. First, a silane coupling agent is prepared that has an organic functional group, or an acrylic group as a functional group. It should be noted that a silane coupling agent (methacrylsilane) having a methacrylic group was used for the inorganic fillers A and D; however, a silane coupling agent having an acrylic group may be used, or a silane coupling agent may also be used that has as an organic functional group an acryloyl group, an acrylyl group, an acyl group, or a methacrylic group. The silane coupling agent having an acrylic group is formed on a surface of an inorganic filler (e.g., alumina particles having an average particle size of 0.7 μm or 3.5 μm) prepared in advance by dry processing or wet processing.

In the dry processing, for example, a predetermined amount of the inorganic filler is charged into an apparatus such as a Henschel mixer, and a solution containing the silane coupling agent is dropped or sprayed to the inorganic filler under stirring. Then, after sufficient stirring, drying is last performed at a temperature from 20° C. to 150° C. for 30 minutes to 90 minutes. During the drying, the silane coupling agent and the inorganic filler cause a chemical reaction, so that the acrylic group-containing organic functional group included in the silane coupling agent is aligned on a surface (outside) of the inorganic filler. It should be noted that the inorganic filler may be pulverized with, for example, a ball mill after the drying as necessary.

In the wet processing, the inorganic filler is dispersed in, for example, water or an alcohol solvent to make a slurry state, and then a solution containing the silane coupling agent is added to the slurry state inorganic filler. These are sufficiently stirred, and then filtrated to extract the inorganic filler that has been treated with the silane coupling agent. Also in the wet processing, drying is performed at a temperature from 20° C. to 150° C. for 30 minutes to 90 minutes, and the inorganic filler may also be pulverized by, for example, a ball mill after the drying as necessary.

As the solution containing the silane coupling agent, there can be used an aqueous or alcohol solvent. The aqueous or alcohol solvent is useful for a reaction such as hydrolysis of the silane coupling agent. It should be noted that in a case of a silane coupling agent having, for example, an acrylic group or a methacrylic group as an organic functional group, the organic functional group becomes hydrophobic, possibly leading to a decrease in solubility of the silane coupling agent in water (e.g., pure water) having a pH of 7. In such a case, when the pH of water is adjusted to a pH ranging from 3.5 to 4.0 with use of an organic acid such as acetic acid, formic acid, or lactic acid, the silane coupling agent can be comparatively easily dissolved. As described above, the silane coupling agent is formed as an adsorption layer or a reaction layer on a surface of the inorganic filler.

Further, with use of the acrylic group included in the silane coupling agent, the thermosetting acrylic resin contained in the resin composition may be made to have affinity or may be chemically reacted with the surface of the inorganic filler on which the silane coupling agent has been formed.

[Evaluation Test]

The resin composition in each of the examples and the comparative examples is evaluated according to following tests. Results are shown in Tables 1 and 2. Each of the tests will be described in detail below.

TABLE 1

|  |  | Examples | | Comparative Examples | | | |
|---|---|---|---|---|---|---|---|
|  |  | 1 | 2 | 1 | 2 | 3 | 4 |
| Composition (Parts by mass) | Thermosetting acrylic resin A | 65 | 70 | — | 65 | 70 | 70 |
|  | Thermosetting acrylic resin B | 35 | 30 | — | 35 | 30 | 30 |
|  | Peroxide | 1 | 1 | — | 1 | 1 | 1 |
|  | Epoxy resin | — | — | 100 | — | — | — |
|  | Curing agent | — | — | 0.8 | — | — | — |
|  | Inorganic filler A | 75 | 80 | — | — | — | — |
|  | Inorganic filler B | — | — | 75 | 75 | 80 | — |
|  | Inorganic filler C | — | — | — | — | — | 80 |
| Evaluation | Initial total organic carbon content of inorganic filler (% by mass) | 0.16 | 0.16 | 0 | 0 | 0 | 0.40 |
|  | Total organic carbon content of inorganic filler after 8-time ultrasonic cleaning (% by mass) | 0.14 | 0.14 | 0 | 0 | 0 | 0.09 |
|  | Viscosity (Pa · s) | 14 | 37 | 30 | 30 | 68 | 65 |
|  | Coatability | A | B | B | B | C | C |
|  | Coefficient of thermal conductivity of cured product (W/mK) | 1.2 | 1.7 | 1.2 | 1.2 | 1.7 | 1.7 |
|  | Moisture absorptivity of cured product (% by mass) | 0.4 | 0.6 | 0.9 | 0.9 | 1.3 | 1.1 |
|  | Moisture absorption reflow test | A | A | B | B | B | B |
|  | Void | A | A | B | A | A | A |

TABLE 2

|  |  | Examples | | | Comparative Examples | |
|---|---|---|---|---|---|---|
|  |  | 3 | 4 | 5 | 5 | 6 |
| Composition (Parts by mass) | Thermosetting acrylic resin A | 70 | 65 | 60 | 60 | 60 |
|  | Thermosetting acrylic resin B | 30 | 35 | 40 | 40 | 40 |
|  | Peroxide | 1 | 1 | 1 | 1 | 1 |
|  | Inorganic filler D | 80 | 80 | 80 | — | — |
|  | Inorganic filler E | — | — | — | 80 | — |
|  | Inorganic filler F | — | — | — | — | 80 |
| Evaluation | Initial total organic carbon content of inorganic filler (% by mass) | 0.21 | 0.46 | 0.91 | 0 | 0.40 |
|  | Total organic carbon content of inorganic filler after twice ultrasonic cleaning (% by mass) | 0.19 | 0.41 | 0.83 | 0 | 0.09 |
|  | Total organic carbon content of inorganic filler after 4-time ultrasonic cleaning (% by mass) | 0.18 | 0.41 | 0.82 | 0 | 0.09 |

TABLE 2-continued

|  |  | Examples | | | Comparative Examples | |
|---|---|---|---|---|---|---|
|  |  | 3 | 4 | 5 | 5 | 6 |
|  | Total organic carbon content of inorganic filler after 8-time ultrasonic cleaning (% by mass) | 0.18 | 0.40 | 0.81 | 0 | 0.09 |
|  | Viscosity (Pa · s) | 49 | 43 | 39 | 65 | 65 |
|  | Coatability | B | B | B | C | C |
|  | Coefficient of thermal conductivity of cured product (W/mK) | 1.6 | 1.6 | 1.6 | 1.6 | 1.6 |
|  | Moisture absorptivity of cured product (% by mass) | 0.6 | 0.5 | 0.4 | 1.2 | 1.3 |
|  | Moisture absorption reflow test | A | A | A | B | B |
|  | Void | A | A | A | A | A |

(1) Evaluation of Total Organic Carbon Content

An "initial total organic carbon content" of the inorganic filler refers to a total organic carbon content of the inorganic filler on which the silane coupling agent has been formed and a measurement result before the inorganic filler is kneaded with the thermosetting acrylic resin in liquid phase.

A "total organic carbon content after ultrasonic cleaning" of the inorganic filler refers to a measurement result after the inorganic filler is, by an ultrasonic cleaning method, isolated from an uncured resin composition. That is, the total organic carbon content after ultrasonic cleaning refers to a total organic carbon content of an organic adsorption layer left as a residue on the surface of the inorganic filler after, for example, 2 to 8-time ultrasonic cleaning. The organic adsorption layer left as a residue may contain, in addition to the silane coupling agent that has not been desorbed from the surface of the inorganic filler by, for example, ultrasonic cleaning, an acrylic resin and the like that have affinity for the silane coupling agent.

For measurement to the total organic carbon content of the inorganic filler are used SHIMADZU total organic carbon analyzer TOL-LCPH and solid sample combustion apparatus SSA-5000A, and the measurement is performed at a furnace temperature of 900° C. and a carrier gas flow rate of 400 mL/min. A calibration curve is formed with use of 100 μL of a 1% glycol aqueous solution. In the measurement, 100 mg of a sample is weighed out into a sample board.

In addition, the inorganic filler is isolated from an uncured resin composition as described below. First, the resin composition (1 g) is charged into a test tube and immersed in about 3 mL of distilled chloroform, followed by application of an ultrasonic wave for 10 minutes. In the application of an ultrasonic wave, an ultrasonic wave having a frequency of 28 kHz and an output of 100 W is applied for 10 minutes with use of VS-100 manufactured by AS ONE Corporation. Then, a supernatant is removed by centrifugation. The centrifugation is performed with use of H-19FMR manufactured by KOKUSAN Co. Ltd. The centrifugation is performed by applying centrifugal force at a rotation speed of 3200 rpm and a temperature of 20° C. for 15 minutes. The operation described above is repeated twice to 8 times, and then the inorganic filler is left to stand still until naturally dried.

(2) Evaluation of Viscosity

The viscosity of the resin composition is measured at a temperature of 25° C. and a rotation speed of 50 rpm with use of a B-type viscometer (DV-II manufactured by Brookfield AMETEK, with a rotor having a diameter of 8.74 mm).

As a result of measuring the viscosity of the resin compositions each containing alumina that has been treated with a silane coupling agent, the resin composition containing 75 parts by mass of alumina in Example 1 has a viscosity of 14 Pa·s. In addition, the resin compositions each containing 80 parts by mass of alumina in Examples 2 to 5 have a viscosity of 37 to 49 Pa·s. Even though a ratio of alumina is high as described above, the resin compositions are low in viscosity.

On the other hand, as to the viscosity of the resin compositions containing alumina that has not been treated with a coupling agent, the resin compositions each containing 75 parts by mass of alumina in Comparative Examples 1 and 2 have a viscosity of 30 Pa's. In addition, the resin compositions each containing 80 parts by mass of alumina in Comparative Examples 3 and 5 have viscosities of 68 Pa's and 65 Pa's, respectively. Thus, the viscosity is high in the comparative examples described above. Meanwhile, in Comparative Examples 4 and 6, an inorganic filler is used that has been treated with such a silane coupling agent as to make a remaining component of the total organic carbon content in proportion less than 0.1% by mass after 8-time ultrasonic cleaning. In these cases, even though a content rate of alumina is 80 parts by mass that is the same amount as in Example 2, the viscosity is 65 Pa's, not sufficiently giving an effect of decreasing the viscosity.

(3) Evaluation of Coatability

The resin composition is applied in such a manner as to draw a double cross pattern with use of an air dispensing apparatus (manufactured by Musashi Engineering, Inc.). In the application, a case of having caused a defect in shape of a coating film or a defect of stringiness is evaluated as "C", a case where such a defect has occurred but a degree of the defect is modest is evaluated as "B", and a case of not having caused such a defect is evaluated as "A". It should be noted that when the evaluation is "B", the evaluation "A" is considered to be attained by optimizing, for example, a coating method.

(4) Thermal Conductivity of Cured Product

A temperature of the resin composition is raised from room temperature to 150° C. over 60 minutes, and subsequently the resin composition is heated for 2 hours while the temperature is kept at 150° C., to manufacture a discotic test piece having a diameter of 2 cm and a thickness of 1 mm. A thermal diffusion coefficient ($\alpha$) of the test piece is measured by a laser flash method (t½ method). Together with the thermal diffusion coefficient, specific heat (Cp) is measured by a DSC method, and density ($\rho$) is measured in accordance with JIS K6911. From these values, a coefficient of thermal conductivity ($=\alpha \times Cp \times \rho$) was measured. It should be noted that a test piece having a coefficient of thermal conductivity of 1 W/m·K or more can be evaluated as having excellent thermal conductivity.

It should be noted that in JIS K6911, specific gravity S of a test piece (formed article) is measured as described below, and a measured value is defined as the density ($\rho$). First, a surface of the test piece is smoothened by an appropriate method so as to prevent air bubbles from attaching to the surface when the test piece is immersed in a liquid. Next, mass (W) of the test piece is measured to an extent of 1 mg unit in air at a temperature of 23° C.±2° C. The test piece is bound with one end of a fine metal wire and immersed in distilled water at a temperature of 23° C.±2° C. in a beaker, and another end of the metal wire is hung at a scale. While this state is kept, mass (W1) of the test piece and the metal wire is measured to an extent of 1 mg unit. Next, the test piece is removed from the metal wire, only the metal wire is hung in the distilled water, and mass (w) of the metal wire is measured. The specific gravity S is calculated according to a following equation.

$$S=W/(W-W1+w)$$

As shown in Tables 1 and 2, all the cured products of the resin compositions obtained in Examples 1 to 5 and Comparative Examples 1 to 6 have a coefficient of thermal conductivity of 1 (W/mK) or more, thus having excellent thermal conductivity.

(5) Moisture absorptivity of cured product

First, a test piece is manufactured under the same conditions as in "Thermal conductivity of cured product" described above. The test piece is heated and dried at a temperature of 180° C. for 12 hours to remove residual moisture from the test piece. Immediately after the heating and drying, weight of the test piece is measured. Subsequently, the test piece is left to stand still in a desiccator, in which the temperature is controlled to a temperature of 25° C.±5° C., for 24 hours. Subsequently, the test piece is exposed to an atmosphere at 60° C. and 60% RH for 60 hours, and immediately after the exposure, weight of the test piece is measured. Moisture absorptivity of the test piece is calculated as follows.

(Moisture absorptivity)={(Mass of test piece immediately after moisture absorption)−(mass of test piece immediately after drying)}/(mass of test piece immediately after moisture absorption)× 100

As a result, the moisture absorptivity in Examples 1 to 5 is 0.4% to 0.6%, which is lower than a moisture absorptivity of 0.9% to 1.3% in Comparative Examples 1 to 6. The same tendency is found also in both cases of the inorganic fillers having average particle sizes of 3.5 μm and 0.7 μm.

The results described above shows that use of alumina that has been treated with a silane coupling agent can make the moisture absorptivity of a cured product smaller than use of alumina that has not been treated with a coupling agent.

(6) Moisture Absorption Reflow Test

A semiconductor chip is prepared that has a size of 7.3 mm×7.3 mm×0.15 mm, a pitch of bump electrodes of 50 μm, and a number of bump electrodes of 544. A bump electrode in the semiconductor chip includes a pillar and a solder bump, and the solder bump is made from lead-free solder (Sn-3.5Ag: melting point 221° C.). As a substrate, a glass epoxy substrate is prepared, the glass epoxy substrate including a copper conductive wiring on which a rust preventive film is provided by pre-flux processing.

The substrate is fixed onto a stage of a flip-chip bonder while the stage is heated to a temperature ranging from 60° C. to 100° C. The resin composition from 3.0 mg to 4.0 mg is applied onto the substrate by a dispenser. It should be noted that an amount of the resin composition may be appropriately optimized according to a size of the semiconductor chip.

The semiconductor chip is held by a bonding head of the flip-chip bonder, and the bonding head is approximated to the stage while heated at a temperature of 130° C. As described above, the semiconductor chip is disposed on the substrate at a position where the resin composition has been applied. In the disposition, both the bump electrode of the semiconductor chip and an electrode pad of the substrate are positioned so as to bring the bump electrode and the electrode pad into contact with each other. It should be noted that a temperature of the bonding head may be appropriately set within a range from 100° C. to 160° C.

While this state is kept, the semiconductor chip is pressed against the substrate for 0.5 seconds. It should be noted that this period may be appropriately set within a range from 0.1 seconds to 3 seconds.

Subsequently, while a load of 30 N is applied from the bonding head to the semiconductor chip, the temperature of the bonding head is raised to a maximum achieving temperature of 260° C. over 1.5 seconds. It should be noted that the load may be appropriately set within a range from 15 N to 40 N, and a period required to raise the temperature may be appropriately set within a range from 1 second to 2.5 seconds. In addition, the maximum achieving temperature may be appropriately set within a range from 220° C. to 280° C.

Subsequently, the temperature of the bonding head is kept at the maximum achieving temperature for 2 seconds, and then the bonding head is released from holding the semiconductor chip and separated from the stage. About 4 seconds is required as a period from disposition of the semiconductor chip on the substrate to separation of the bonding head from the stage. It should be noted that a period during which the maximum achieving temperature is kept may be appropriately set within a range from 0.5 seconds to 5 seconds, and the period from disposition of the semiconductor chip on the substrate to separation of the bonding head from the stage may be appropriately set within a range from 1.5 seconds to 10 seconds.

A semiconductor device that has been manufactured as described above is exposed to an atmosphere under conditions of 60° C. and 60% RH for 192 hours. Subsequently, the semiconductor is made to pass through a reflow furnace three times at a temperature profile with a highest temperature of 260° C. Subsequently, a cured product of the resin composition is inspected with use of a scanning acoustic tomograph (SAT) for presence or absence of a crack in the cured product of the resin composition and for presence or absence of peeling in an interface between the cured product and the semiconductor chip and in an interface between the cured product and the substrate.

This test has been performed for 5 samples per each of the examples and comparative examples. As a result, a case where neither a crack nor peeling in the interface is found in any of the samples is evaluated as "A", and a case where a crack or peeling is found even in one place of any of the 5 samples is evaluated as "B".

As shown in Tables 1 and 2, all the examples are evaluated as "A". On the other hand, all the comparative examples are evaluated as "B". In comparative examples, it is determined that a problem relates to reliability in moisture resistance may possibly occur.

(7) Evaluation of void

A semiconductor device is manufactured in the same manner as in the moisture absorption reflow test described above. The semiconductor device is inspected with use of a scanning acoustic tomograph (SAT) for presence or absence of a void in a cured product of the semiconductor device. As a result, a case where a void is not found is evaluated as "A", and a case where a void is found is evaluated as "B".

As shown in Tables 1 and 2, no void is found in Examples 1 to 5 and Comparative Examples 2 to 6, where a thermosetting acrylic resin is used, whereas a void is generated in Comparative Example 1, where an epoxy resin is used in place of the thermosetting acrylic resin.

Hereinafter, results in Tables 1 and 2 will be described.

In Examples 1 and 2 of Table 1, the inorganic filler A is used that has been treated with the silane coupling agent having a methacrylic group. The inorganic filler is alumina particles having an average particle size of 3.5 μm and has an initial total organic carbon content in proportion of 0.16% by mass before kneaded as a resin composition. In these cases, the viscosity is as low as 14 Pa's to 37 Pa's, the coatability is as preferable as A to B, and the coefficient of thermal conductivity of the cured product is as excellent as 1.2 W/mK to 1.7 W/mK. In addition, the moisture absorptivity of the cured product ranges from 0.4% by mass to 0.6% by mass, the evaluation of the moisture absorption reflow test is A, and the evaluation of a void is also A. As described above, one of reasons of obtaining excellent results in Examples 1 and 2 is considered to be that the total organic carbon content in proportion after 8-time ultrasonic cleaning is as high as 0.14% by mass. That is, use of the silane coupling agent having a methacrylic group makes as much as 88% by mass of the initial adsorption layer strongly attached (or left) on the surface of the inorganic filler even after the 8-time ultrasonic cleaning. Thus, it is understood that attachment strength of the adsorption layer provided on the surface of the inorganic filler is increased to give excellent characteristics.

In Comparative Example 1 of Table 1, an epoxy resin is used in place of the acrylic resin. It is understood that a cured product such as in Examples 1 and 2 cannot be obtained in case of using the epoxy resin. It is confirmed that the resin composition can give a good result when having a content proportion of a thermosetting epoxy resin of 0% by mass or having a content of a thermosetting epoxy resin less than a content of the thermosetting acrylic resin.

According to Comparative Examples 1 to 3 of Table 1, it is understood that, in case of using the inorganic filler B on which a coupling treatment is not performed, the viscosity of the resin composition increases, the coatability of the resin composition decreases, the moisture absorptivity of a cured product increases, and a problem in the moisture absorption reflow test may possibly occur.

In Comparative Example 4 of Table 1, the inorganic filler C that has been treated with hydroxy-terminated dimethylpolysiloxane is used. With use of the inorganic filler C, in spite of the fact that the initial total organic carbon content in proportion is as high as 0.40% by mass, the viscosity is high and the coatability is low. In addition, in Comparative Example 4, it is understood that a solidified product has high moisture absorptivity, and a problem in the moisture absorption reflow test may possibly occur. When the inorganic filler C used in Comparative Example 4 is isolated from the resin composition, the total content of organic carbon left on the surface of the inorganic filler C is, in proportion, as less as 0.09% by mass after the 8-time ultrasonic cleaning From the facts described above, it is considered that the silane coupling agent in Comparative Example 4 is low in adhesiveness to alumina particles, so that most of the silane coupling agent has been removed from the surface of the alumina particles by the ultrasonic cleaning. As shown in Comparative Example 4, it is understood that low adhesiveness between a body of an inorganic filler such as alumina particles and a silane coupling agent formed on a surface of the body may possibly affect reliability in, for example, a cured product.

In Examples 3 to 5 of Table 2, a silane coupling agent having a methacrylic group is used as the inorganic filler D. According to Examples 3 to 5, it is understood that when the inorganic filler for producing the resin composition has a total organic carbon content in proportion ranging from 0.1% by mass to 1.0% by mass, inclusive, further from 0.21% by mass to 0.91% by mass, inclusive, the moisture absorptivity of the cured product can be decreased to improve a property of moisture absorption reflow of the cured product. Further, in Examples 3 to 5, ultrasonic cleaning is repeated 2, 4, or 8 times to isolate the inorganic filler from the resin composition. The total organic carbon content, however, has hardly changed in each inorganic filler isolated. Accordingly, the ultrasonic cleaning may be twice to 4 times actually.

As shown in Examples 3 to 5, the total organic carbon content even after the isolation accompanied by the plurality of times of ultrasonic cleaning is comparable with the initial total organic carbon content, and the moisture absorption reflow test is evaluated as A. Accordingly, Examples 3 to 5 indicates considerably high adsorption power between the body of the inorganic filler such as alumina particles and the silane coupling agent. In order to increase the adsorption power as described above, it is useful to increase the adsorption power between the body of the inorganic filler and the silane coupling agent as well as to increase affinity and a chemical bonding property between the silane coupling agent and the thermosetting resin (acrylic resin) in liquid phase.

On the other hand, in Comparative Examples 5 and 6, the inorganic filler has a total organic carbon content in proportion of less than 0.1% by mass after the isolation accompanied by the plurality of times of ultrasonic cleaning, and the moisture absorption reflow test is evaluated as B.

It should be noted that although detailed results are not shown, an influence of the average particle size of the inorganic filler is also studied. As a result, the inorganic filler having an average particle size of less than 0.5 µm is likely to increase the viscosity of the resin composition. In addition, the inorganic filler having an average particle size of more than 10 µm may possibly affect electric connection stability between the semiconductor chip and the substrate when a semiconductor device is produced. In contrast, the inorganic filler having an average particle size ranging from 0.5 µm to 10 µm, inclusive, facilitates application of the resin composition even when contained in a content proportion ranging from 50% by mass to 95% by mass, inclusive, relative to a whole resin composition. Further, this makes the semiconductor chip preferably adhere to a cured product of the resin composition.

It should be noted that although detailed results are now shown, also studied in detail are presence or absence of a treatment of the inorganic filler with the silane coupling agent and the total organic carbon content. As a result, the inorganic filler having a total organic carbon content in proportion of less than 0.1% by mass may possibly affect an effect of reducing the moisture absorptivity of a cured product. In addition, the inorganic filler that has been treated with the silane coupling agent and has a total organic carbon content in proportion of more than 1.0% by mass may possibly increase the viscosity of the resin composition. Accordingly, the inorganic filler that has been treated with the silane-based coupling agent and has a total organic carbon content in proportion ranging from 0.1% by mass to 1.0% by mass, inclusive, makes the moisture absorptivity of a cured product 1.0% by mass or less, increasing reliability in moisture absorption reflow.

Although detailed results are not also shown, the average particle size of the inorganic filler is studied based on the premise that the inorganic filler has a total organic carbon content in proportion ranging from 0.1% by mass to 1.0% by mass, inclusive. As a result, following knowledge is obtained. The inorganic filler having an average particle size of less than 0.1 µm increases the viscosity of the sealing acrylic resin composition, even when the total organic carbon content is increased, decreasing dispersibility of the inorganic filler in the sealing acrylic resin composition, so that the coefficient of thermal conductivity of a cured product is less likely to increase. On the other hand, the inorganic filler having an average particle size of more than 5 µm makes particles of the inorganic filler likely to remain near a bump connection part, affecting initial electric connection and also further affecting reliability. From the facts described above, the inorganic filler preferably has an average particle size ranging from 0.1 µm to 5 µm, inclusive.

In Examples 1 and 2, alumina particles that have been treated with the silane coupling agent having a methacrylic group are used as the inorganic filler to give a low-viscosity resin composition. Alternatively, the inorganic filler can also be used whose body is treated with the silane coupling agent having a phenyl group, to give a low-viscosity resin composition. This is considered to be because the phenyl group and the methacrylic group in the silane coupling agent increase compatibility between the silane coupling agent and the thermosetting acrylic resin.

A content rate of the inorganic filler in the resin composition is also studied. As a result, it is confirmed that the resin composition having a content rate of the inorganic filler ranging from 50 parts by mass to 95 parts by mass, inclusive, is low in viscosity to make operability preferable and gives cured product 42 excellent thermal conductivity. The resin composition having a content proportion of the inorganic filler of less than 50% by mass may possibly decrease the coefficient of thermal conductivity of the cured product. The resin composition having a content proportion of the inorganic filler of more than 95% by mass may possibly increase the viscosity to affect operability.

As described above, in the present exemplary embodiment, the viscosity of the resin composition is measured under conditions a temperature of 25° C. and a rotation speed of 50 rpm with use of a B-type rotational viscometer. A viscosity ranging from 5 Pa·s to 100 Pa·s, inclusive, stabilizes a delivery amount during application of the resin composition with use of a dispenser. In addition, a shape of the resin composition is stable after application. In contrast, a viscosity of less than 5 Pa·s does not possibly allow the resin composition to maintain its shape after application. Further, a viscosity of more than 60 Pa·s may possibly cause the resin composition to vary its shape after application due to variation in delivery amount of the resin composition.

The inorganic filler in Examples 1 and 2 is alumina. It is confirmed, however, that the inorganic filler that is silica, aluminum nitride, or magnesium oxide can also give a cured product that similarly has high moisture resistance and a high coefficient of thermal conductivity.

It should be noted that in the resin composition according to the present exemplary embodiment, it is useful to set the content proportion of an epoxy resin to 0% by mass. It is also possible, however, to add a small amount of a thermosetting epoxy resin according to a use. When a thermosetting epoxy resin is added to the resin composition, it is useful to make the content of epoxy in the resin composition smaller than the content of the thermosetting acrylic resin.

A thermosetting acrylic resin composition according to the present invention is suitable for a use of sealing a semiconductor.

The invention claimed is:
1. A sealing acrylic resin composition comprising:
a thermosetting acrylic resin in liquid phase;
an organic peroxide; and
an inorganic filler, wherein:
the thermosetting acrylic resin includes
tricyclodecane dimethanol diacrylate and
bisphenol A epoxy acrylate,
wherein a content proportion of tricyclodecane dimethanol diacrylate is greater than a content proportion of bisphenol A epoxy acrylate,
a silane coupling agent is bonded to the inorganic filler, a total organic carbon content of the inorganic filler in proportion being ranging from 0.1% by mass to 1.0% by mass, inclusive, in a state before the inorganic filler is mixed with at least one of the thermosetting acrylic resin and the organic peroxide,
the silane coupling agent has an acrylic group,
the inorganic filler includes alumina, and
a content proportion of the inorganic filler in the sealing acrylic resin composition ranges from 70% by mass to 95% by mass, inclusive.

2. The sealing acrylic resin composition according to claim 1, further comprising a thermosetting epoxy resin whose content is smaller than a content of the thermosetting acrylic resin.

3. The sealing acrylic resin composition according to claim 1, wherein the silane coupling agent further has at least one of a vinyl group and an epoxy group.

4. The sealing acrylic resin composition according to claim 1, wherein the sealing acrylic resin composition has a viscosity ranging from 5 Pa's to 100 Pa's, inclusive, as measured by using a B-type rotational viscometer under conditions at a temperature of 25° C. and a rotation speed of 50 rpm.

5. The sealing acrylic resin composition according to claim 1, further comprising flux.

6. The sealing acrylic resin composition according to claim 1, wherein a total organic carbon content of the inorganic filler in proportion is 0.1% by mass or more, in a state after the inorganic filler is isolated, by ultrasonic cleaning, from the sealing acrylic resin composition that is uncured.

7. A thermally cured product of the sealing acrylic resin composition according to claim 1,
the thermally cured product having a coefficient of thermal conductivity ranging from 1.0 W/mK to 10 W/mK, inclusive.

8. A method for producing the sealing acrylic resin composition according to claim 1, the method comprising the steps of:
preparing the inorganic filler to which the silane coupling agent is bonded at a total organic carbon content in proportion ranging from 0.1% by mass to 1.0% by mass, inclusive; and
making the organic peroxide, the inorganic filler on which the silane coupling agent has been formed, and the thermosetting acrylic resin in liquid phase coexist, wherein:
the inorganic filler is contained in a content proportion ranging from 70% by mass to 95% by mass, inclusive.

9. A semiconductor device comprising:
a substrate provided with a conductive wiring;
a semiconductor chip that includes a bump electrode, the semiconductor chip being mounted with a face-down mounting on the substrate so that the bump electrode is electrically connected to the conductive wiring; and
a cured product of the sealing acrylic resin composition according to claim 1 which fills a gap between the substrate and the semiconductor chip.

10. A method for producing a semiconductor device, the method comprising the steps of:
disposing the sealing acrylic resin composition according to claim 1 on a substrate provided with a conductive wiring;
disposing a semiconductor chip including a bump electrode on the substrate at a position where the sealing acrylic resin composition has been disposed, so that the bump electrode is disposed on the conductive wiring; and
heating the sealing acrylic resin composition and the bump electrode so that a cured product is formed by curing the sealing acrylic resin composition, and so that the bump electrode is electrically connected to the conductive wiring by melting the bump electrode.

11. The sealing acrylic resin composition according to claim 1, wherein:
a content proportion of the tricyclodecane dimethanol diacrylate ranges from 10% by mass to 50% by mass, inclusive, and
a content proportion of the bisphenol A epoxy acrylate ranges from 5% by mass to 30% by mass, inclusive.

12. The sealing acrylic resin composition according to claim 1, wherein the sealing acrylic resin composition:
contains no epoxy resin or
contains an epoxy resin at a content proportion by mass smaller than a content proportion by mass of the thermosetting acrylic resin.

* * * * *